United States Patent
Kang

(10) Patent No.: US 7,623,374 B2
(45) Date of Patent: Nov. 24, 2009

(54) NON-VOLATILE MEMORY DEVICES AND METHODS OF PROGRAMMING THE SAME

(75) Inventor: Dong-ku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 11/808,600

(22) Filed: Jun. 12, 2007

(65) Prior Publication Data

US 2007/0291536 A1    Dec. 20, 2007

(30) Foreign Application Priority Data

Jun. 12, 2006    (KR) .................... 10-2006-0052605

(51) Int. Cl.
*G11C 16/04* (2006.01)
(52) U.S. Cl. ............... 365/185.03; 365/185.2; 365/185.19; 365/185.24; 365/185.07; 365/185.09; 365/185.12; 365/185.22
(58) Field of Classification Search ............. 365/185.2, 365/185.19, 185.03, 185.24, 185.07, 185.09, 365/185.12, 185.22
See application file for complete search history.

(56) References Cited

U.S. PATENT DOCUMENTS

| | | | |
|---|---|---|---|
| 5,923,587 A | 7/1999 | Choi | |
| 6,075,734 A | 6/2000 | Jang | |
| 6,122,188 A | 9/2000 | Kim et al. | |
| 6,807,095 B2 | 10/2004 | Chen et al. | |
| 6,925,004 B2 | 8/2005 | Shibata et al. | |
| 7,450,421 B2 * | 11/2008 | Mokhlesi et al. | 365/185.17 |
| 2007/0103978 A1 * | 5/2007 | Conley et al. | 365/185.09 |

FOREIGN PATENT DOCUMENTS

| | | |
|---|---|---|
| JP | 2001-043143 | 2/2001 |
| JP | 2004-192789 | 7/2004 |
| KR | 10-2000-0018838 A | 4/2000 |
| KR | 10-2001-0005149 A | 1/2001 |
| KR | 10-2002-0081925 | 10/2002 |
| KR | 10-2003-0011248 | 2/2003 |
| KR | 10-2004-0048344 | 6/2004 |

* cited by examiner

*Primary Examiner*—Hoai V Ho
*Assistant Examiner*—Fernando N Hidalgo
(74) *Attorney, Agent, or Firm*—Harness, Dickey & Pierce, P.L.C.

(57) ABSTRACT

A non-volatile memory device and method thereof are provided. The example non-volatile memory device may include a plurality of main cells, each of the plurality of main cells arranged at first intersection regions between one of a plurality of word lines and one of a plurality of main bit line pairs and a plurality of flag cells, each of the plurality of flag cells arranged at second intersection regions between one of the plurality of word lines and a plurality of flag bit line pairs, each of the plurality of flag cells configured to store page information in a manner such that page information associated with main cells corresponding to one of the main bit line pairs is stored in flag cells corresponding to more than one of the flag bit line pairs.

20 Claims, 7 Drawing Sheets

NON-VOLATILE MEMORY DEVICES AND METHODS OF PROGRAMMING THE SAME

PRIORITY STATEMENT

This U.S. non-provisional patent application claims priority under 35 U.S.C. § 119 of Korean Patent Application No. 2006-52605, filed on Jun. 12, 2006, the entire contents of which are hereby incorporated by reference.

BACKGROUND OF THE INVENTION

1. Field of the Invention

Example embodiments of the present invention relate generally to a non-volatile memory device and method thereof.

2. Description of the Related Art

Storage devices, such as volatile memories and non-volatile memories, may be included within conventional mobile devices, such as MP3 players, portable media players (PMPs), mobile phones, notebook computers, personal digital assistances (PDAs), etc. Conventional mobile devices may include relatively high storage capacities so as to provide higher functionality (e.g., video recording, pictures, etc.). A conventional multi-bit memory device storing 2-bit data or multi-bit data in a single memory cell may allow memory cells to obtain a higher storage density.

If 1-bit data is stored in a single memory cell, the memory cell may have a threshold voltage belonging to one of two threshold voltage distributions. That is, the 1-bit memory cell may have two threshold voltage ranges, distributions or "states" corresponding to a first logic level (e.g., a higher logic level or logic "1") or a second logic level (e.g., a lower logic level or logic "0"). In another example, if 2-bit data is stored in a single memory cell, the memory cell may include four separate voltage distributions corresponding to four respective states (e.g., "00", "01", "10", "11").

FIG. 1 illustrates logic states of a conventional 2-bit memory cell. Referring to FIG. 1, the threshold voltage distributions may be controlled in order for the threshold voltage distributions corresponding to the four states be determined within set threshold voltage windows, respectively. An incremental step pulse programming (ISPP) process may be used to control the threshold voltage distributions.

In a conventional ISPP scheme, a threshold voltage may be adjusted by fixed increments of a program voltage during an iterative program loop. Thus, setting a relatively low fixed increment for the program voltage may allow the threshold voltage distributions to be controlled more precisely, such that sufficient margins between different threshold voltage distributions may be maintained. However, if the fixed increments of the program voltage are lower, more time may be required to execute the ISPP process. Thus, the increment of the program voltage may be determined based on a tradeoff between threshold voltage distribution control and execution time.

Even if the ISPP scheme is used, a threshold voltage distribution of each state may become wider, which may likewise reduce the margins between neighboring voltage distributions and increase a likelihood of a memory error (e.g., during a read operation), than a desired window due to any of a number of factors.

FIG. 2 illustrates electric-field coupling/F-poly coupling occurring between conventional memory cells.

Referring to FIG. 2, the threshold voltage distribution may increase because of coupling between adjacent memory cells. The coupling may be referred to as "electric field coupling" or "F-poly coupling". For example, in FIG. 2, it may be assumed that a memory cell MCA may be cell programmed to have any one of four states, and a memory cell MCB may be a cell that programmed to have any one of four states. Under such assumptions, as the memory cell MCB is programmed, charges may accumulate in a floating gate FG. Then, a potential of a floating gate FG of the adjacent memory cell MCA may increase due to coupling with the floating gate FG of the memory cell MCB. A threshold voltage increasing in this manner may be maintained because of the coupling between the floating gates even after the programming operation. The memory cell MCB may include memory cells placed in a word line direction and/or a bit line direction with respect to the memory cell MCA. The coupling between the floating gates of the respective memory cells may cause a threshold voltage of the programmed memory cell MCA to increase, and the threshold voltage distribution may likewise increase, as indicated by the dotted lines of FIG. 2.

A conventional flash memory device may include cells (hereinafter, referred to as a "flag cell") for storing information (hereinafter, referred to as "flag information") related to rows (or pages). The flag information may be programmed into the flag cell under the same conditions as those of main cells belonging to the same row/page.

FIG. 3 is illustrates a program process for conventional flag cells. Referring to FIG. 3, in an example, it may be assumed that each row includes two pages. If a memory cell ① (e.g., placed at an intersection between BLe and WL0) of an even-numbered page belonging to a given row (e.g., WL0) is programmed, a corresponding flag cell ① (e.g., placed at an intersection of FBLe and WL0) in a flag cell region may be selectively programmed. Also, if a memory cell ② (e.g., placed at an intersection of BLo and WL0) of an odd-numbered page belonging to a given row (e.g., WL0) is programmed, a corresponding flag cell ② (e.g., placed at an intersection of FBLo and WL0) in the flag cell region may be selectively programmed. Likewise, if a memory cell ③ (e.g., placed at an intersection of BLe and WL1) of an even-numbered page belonging to the next row (e.g., WL1) is programmed, a corresponding flag cell ③ (e.g., placed at an intersection of FBLe and WL1) in the flag cell region may be selectively programmed. Further, if a memory cell ④ (e.g., placed at an intersection of BLo and WL1) of an odd-numbered page belonging to the row (e.g., WL1) is programmed, a corresponding flag cell ④ (placed at an intersection of FBLo and WL1) in the flag cell region may be selectively programmed.

Referring to FIG. 3, an arrow may indicate F-poly coupling that a previously-programmed cell may receive if a given cell is being programmed. For example, if the flag cell ② is programmed, the flag cell ① may receive F-poly coupling due to the flag cell ②.

In a conventional multi-bit flash memory device, flag cells may be configured to have a threshold voltage associated with the uppermost or highest threshold voltage distribution. Because flag cells may be programmed to have a threshold voltage associated with the uppermost threshold voltage distribution, a threshold voltage of a previously-programmed cell may increase due to the F-poly coupling if an adjacent cell is programmed. For example, referring to FIG. 3, the flag cell ① may receive the F-poly coupling during a program operation of each of the flag cells ②, ③, and ④, which may cause the threshold voltage of the flag cell ① to increase. Similarly, the flag cells ② and ③ may also receive the F-poly coupling, and the threshold voltages of the flag cells ② and ③ may also increase. The increase in the threshold voltage of the flag cell may decrease an on-cell current flowing through a string of the flag cells during a read operation, which may increase an occurrence of read errors.

SUMMARY OF THE INVENTION

An example embodiment of the present invention is directed to a non-volatile memory device, including a plurality of main cells, each of the plurality of main cells arranged at first intersection regions between one of a plurality of word lines and one of a plurality of main bit line pairs and a plurality of flag cells, each of the plurality of flag cells arranged at second intersection regions between one of the plurality of word lines and a plurality of flag bit line pairs, each of the plurality of flag cells configured to store page information in a manner such that page information associated with main cells corresponding to one of the main bit line pairs is stored in flag cells corresponding to more than one of the flag bit line pairs.

Another example embodiment of the present invention is directed to a method of operating a non-volatile memory device, including arranging each of a plurality of main cells at first intersection regions between one of a plurality of word lines and one of a plurality of main bit line pairs and storing page information within at least one of a plurality of flag cells, each of the plurality of flag cells arranged at second intersection regions between one of the plurality of word lines and a plurality of flag bit line pairs, the page information stored in a manner such that page information associated with main cells corresponding to one of the main bit line pairs is stored in flag cells corresponding to more than one of the flag bit line pairs.

Another example embodiment of the present invention is directed to a multi-bit flash memory device and a program method thereof capable of reducing (e.g., minimizing) F-poly coupling occurring between flag cells for storing page information.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Figure 1:
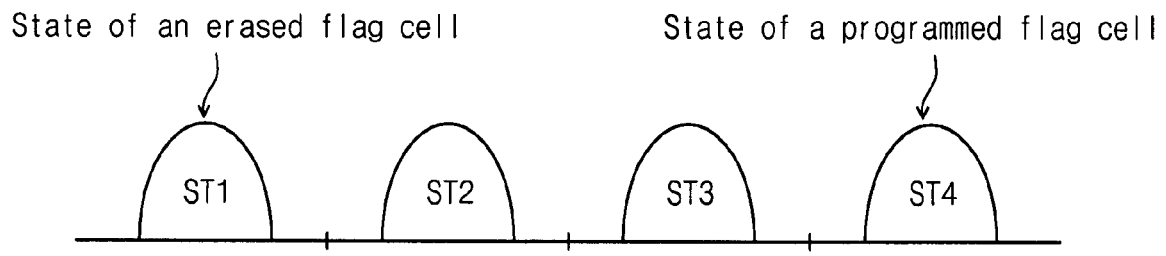
FIG. 1 illustrates logic states of a conventional 2-bit memory cell
Figure 2:
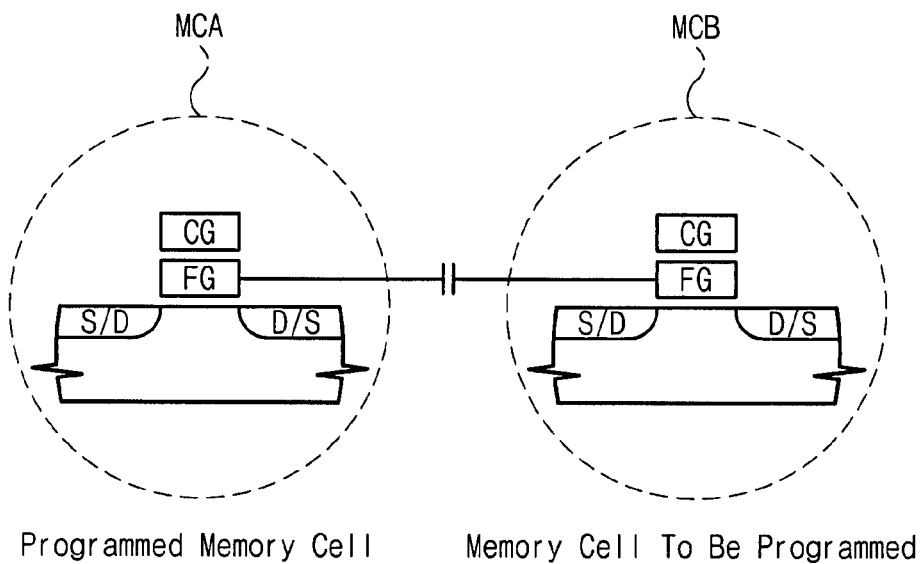
FIG. 2 illustrates electric-field coupling/F-poly coupling occurring between conventional memory cells.
Figure 3:
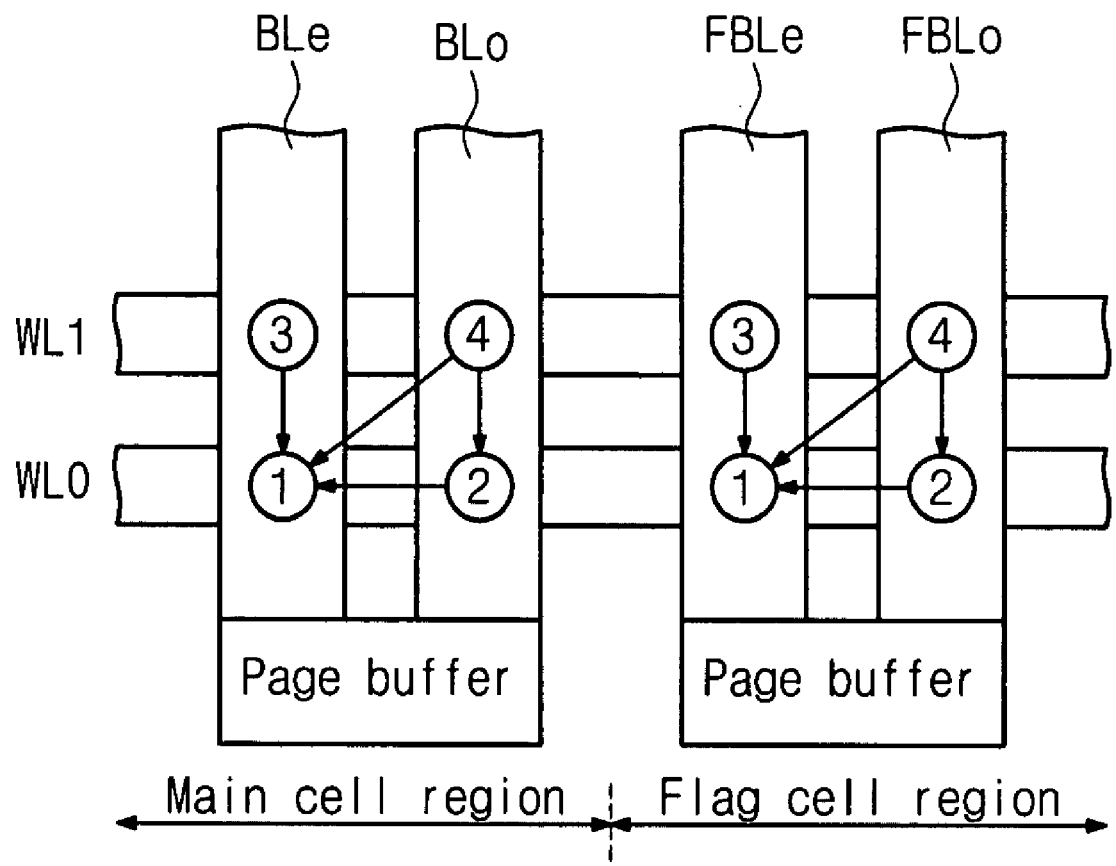
FIG. 3 is illustrates a program process for conventional flag cells

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
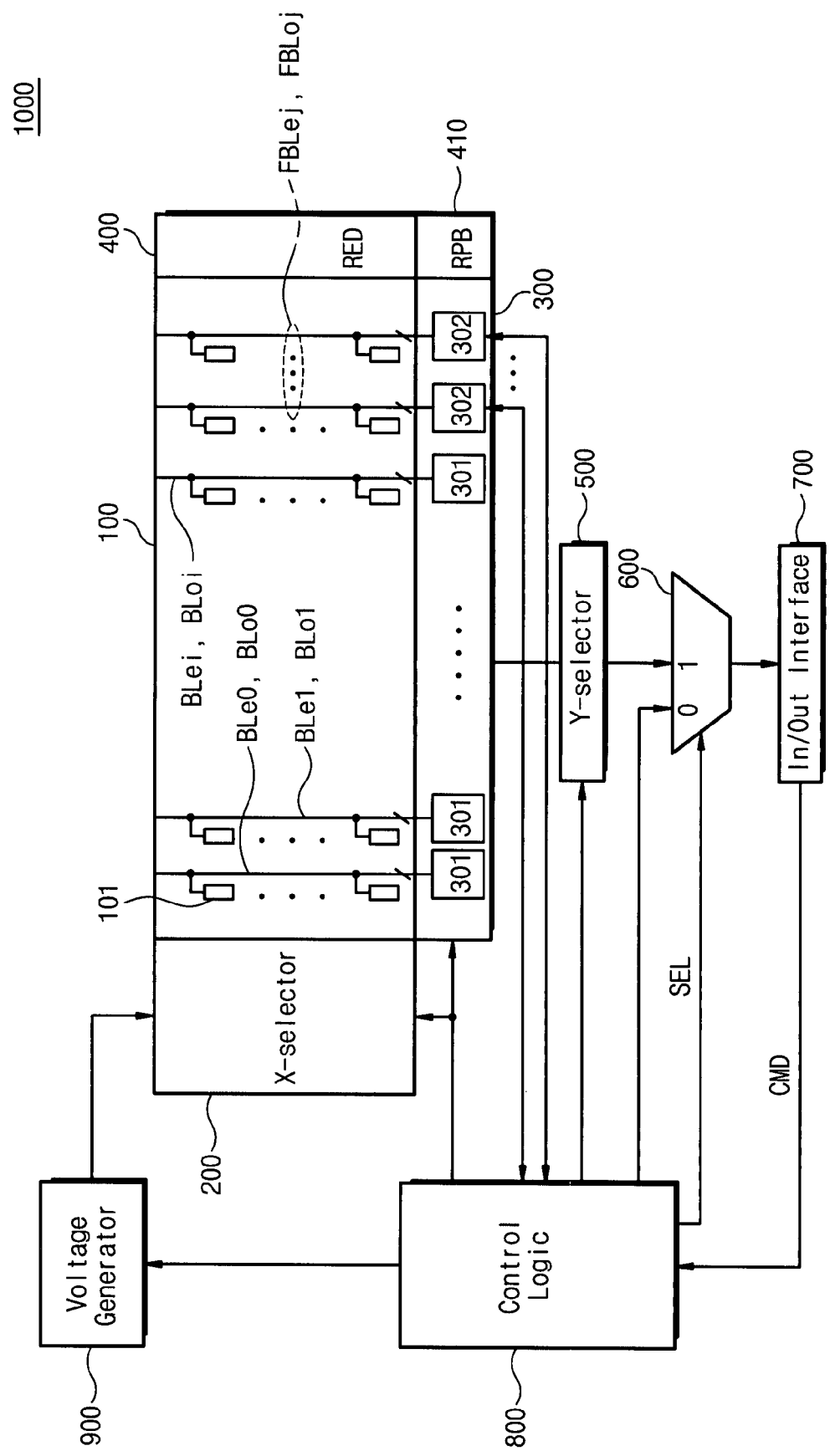
FIG. 4 is a block diagram illustrating a flash memory device according to an example embodiment of the present invention.

FIG. 4 is a block diagram illustrating a flash memory device 1000 according to an example embodiment of the present invention.

In the example embodiment of FIG. 4, the flash memory device 1000 may include a memory cell array 100 for storing multi-bit data information. A plurality of bit line pairs (BLe0, BLo0)-(BLei, BLei) may be arranged on the memory cell array 100. Strings 101 may be connected to bit lines (e.g., referred to as main bit lines) of each pair. Strings 101 of each row may constitute a memory block.

Figure 5:
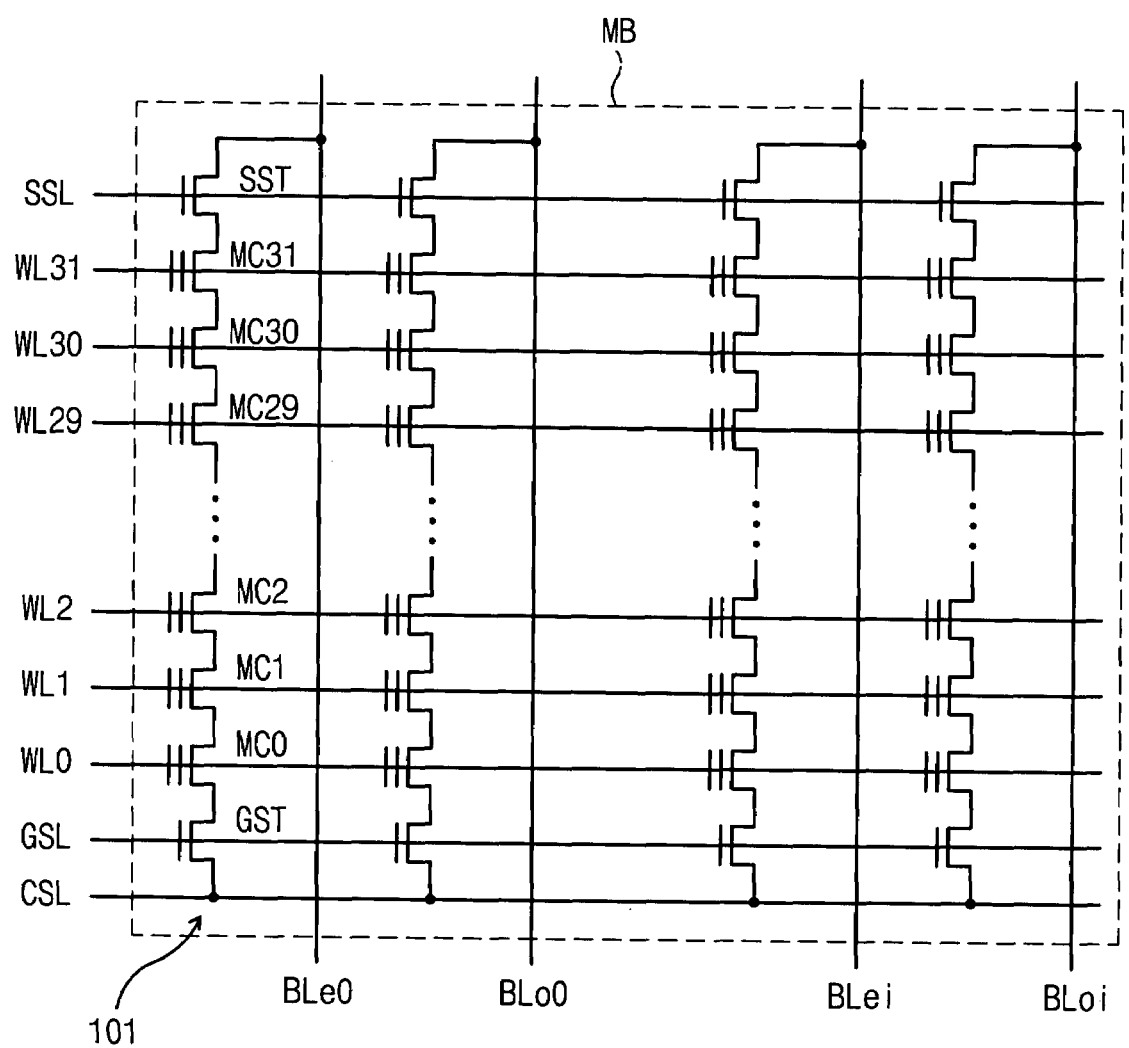
FIG. 5 is a circuit diagram illustrating a portion of a memory cell array of the flash memory device of FIG. 4 according to an example embodiment of the present invention.

FIG. 5 is a circuit diagram illustrating a portion of the memory cell array 100 of FIG. 4 according to an example embodiment of the present invention.

In the example embodiment of FIG. 5, each string 101 of the memory block may include a string selection transistor SST, a ground selection transistor GST, and memory cells MC31-MC0. In an example, the respective memory cells may be configured as floating gate transistors. The string selection transistor SST may be controlled by a string selection line SSL, and may include a drain connected to a corresponding bit line. The ground selection transistor GST may be controlled by a ground selection line GSL, and may include a source connected to a common source line CSL. The memory cells MC31-MC0 may be connected in series between a source of the string selection transistor SST and a drain of the ground selection transistor GST, and may be controlled by corresponding word lines WL31-WL0, respectively. The plurality of bit line pairs (BLe0, BLo0)-(BLei, BLoi) may be arranged to intersect the word lines WL31-WL0. During read/program operations, one bit line in each bit line pair may be selected by a page buffer block 300 of FIG. 4.

Returning to the example embodiment of FIG. 4, the memory cell array 100 may further include a plurality of flag bit line pairs (FBLej, FBLoj). For example, the memory cell array 100 may be provided with at least two pairs of flag bit lines. As described above, strings 101 may be connected to the respective flag bit lines (FBLej, FBLoj). In an example, the strings 101 connected to the flag bit lines (FBLej, FBLoj) may be configured as shown in the example embodiment of FIG. 5. Selection transistors and memory cells constituting each string connected to the flag bit lines (FBLej, FBLoj) may be controlled by a row selection circuit 200 along with the strings belonging to the same row. For example, each memory cell of the bit lines (BLe0, BLo0) and each memory cell of the flag bit lines (FBLej, FBLoj) may be connected to each word line. In an example, the memory cells of each row connected to the flag bit lines (FBLej, FBLoj) may store page information of the same row, and may be programmed or transitioned to an "uppermost" state ST4 (e.g., a highest voltage distribution, such as illustrated as ST4 in FIG. 1). Referring to the flash memory device 1000, memory cells connected to the flag bit lines (FBLej, FBLoj) may be programmed in a different manner than the conventional art, as will be described below in greater detail.

In the example embodiment of FIG. 4, the page buffer block 300 may be controlled by a control logic block 800, and may include page buffers 301 connected to the plurality of bit line pairs (BLe0, BLo0)-(BLei, BLoi). Each page buffer 301 may be operated as a write driver or a detection amplifier based on an operation mode. The page buffer block 300 may further include page buffers 302 connected to the flag bit line pairs (FBLej, FBLoj), respectively. The page buffers 302 may each be set for program data by the control logic block 800 during a program operation. During a program operation, information of a selected word line (e.g., a selected page), may be stored in one of the memory cells of the flag bit lines FBLej or FBLoj connected to the selected word line under control of the control logic block 800, as will be described detain greater detail below. During a read operation, the page information read by the page buffers 302 may be provided to the control logic block 800. The control logic block 800 may be configured to generate a selection signal SEL during a read operation. For example, to output data read by the page buffers 301, the control logic block 800 may transition (e.g., activate) the selection signal SEL to a first logic level (e.g., a higher logic level or logic "1"). Accordingly, in this example, the control logic block 800 may control subsequent operations using the input page information. In an alternative example, to output the page information read by the page buffer 302, the control logic block 800 may transition (e.g., deactivate) the selection signal SEL to a second logic level (e.g., a lower logic level or logic "0"). In this example, the control logic block 800 may output the input page information to the selection circuit 600.

In the example embodiment of FIG. 4, each row/word line may include at least two pages (e.g., even and odd-numbered pages). Accordingly, at least two bit lines BLe and BLo may be electrically connected to one page buffer. In an example, one page (e.g., an even-numbered page) may be selected by the page buffers corresponding to the bit lines BLe corresponding to the even-numbered page. Likewise, another page (e.g., an odd-numbered page) may be selected by the page buffers corresponding to the bit lines BLo corresponding to the odd-numbered page.

In the example embodiment of FIG. 4, the flash memory device 1000 may further include a redundancy array 400 and a redundancy page buffer block 410. The redundancy array 400 may include a redundant bit line pair for replacing one of the flag bit line pairs (BLej, BLoj) and/or a plurality of redundant bit line pairs for replacing pairs of flag bit lines (BLej, BLoj), respectively. Information for the replacement of the flag bit lines may be programmed into the control logic block 800. In an alternative example, the information for the replacement of the flag bit lines may be programmed into a fuse box (not shown). However, it will be appreciated that other example embodiments may store the information related to the replacement of the flag bit lines in any well-known manner. Further, while not explicitly illustrated in FIG. 4, strings may be connected to the redundant or replacement bit lines. The redundancy page buffer block 410 may include a redundancy page buffer connected to at least one redundant bit line pair.

In the example embodiment of FIG. 4, a column selection circuit 500 may be controlled by the control logic 800, and may select the page buffers 301 of the page buffer block 300 by a given unit (e.g., ×8, ×16, ×32, etc.). Data bits of the selected page buffers 301 may be output to a selection circuit 600. The selection circuit 600 may select outputs of the column selection circuit 500 in response to a selection signal SEL, and/or may select page information output from the control logic block 800. For example, if the selection signal SEL is transitioned (e.g., deactivated) to the second logic level (e.g., a lower logic level or logic "0"), the selection circuit 600 may select page information provided from the control logic block 800. If the selection signal SEL is transitioned (e.g., activated) to the first logic level (e.g., a higher logic level or logic "1"), the selection circuit 600 may select an output of the column selection circuit 500.

In the example embodiment of FIG. 4, an input/output interface 700 may provide an external interface (e.g., with a memory controller). A voltage generation circuit 900 may be controlled by the control logic block 800, and may be configured to generate voltages (e.g., word line voltage, bulk voltage, read voltage, pass voltage, etc.) for program/erase/read operations of the flash memory device 1000.

Figure 6:
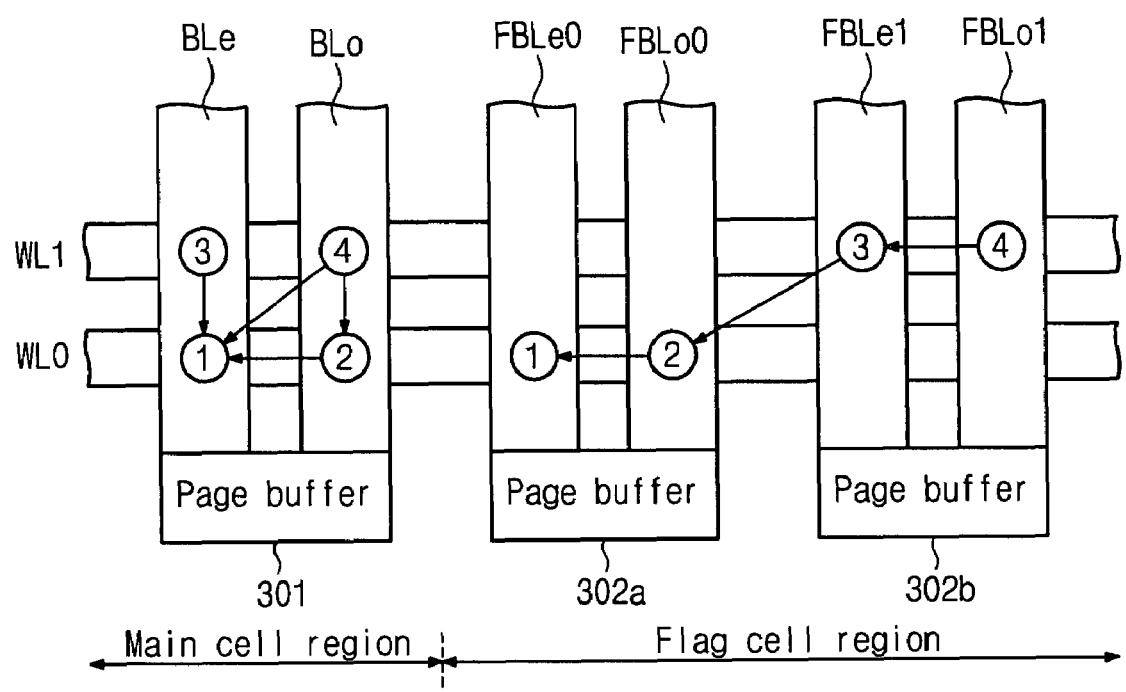
FIGS. 6 through 8 illustrate flag cell program processes for the flash memory device 1000 of FIG. 4 according to example embodiments of the present invention.
Figure 7:
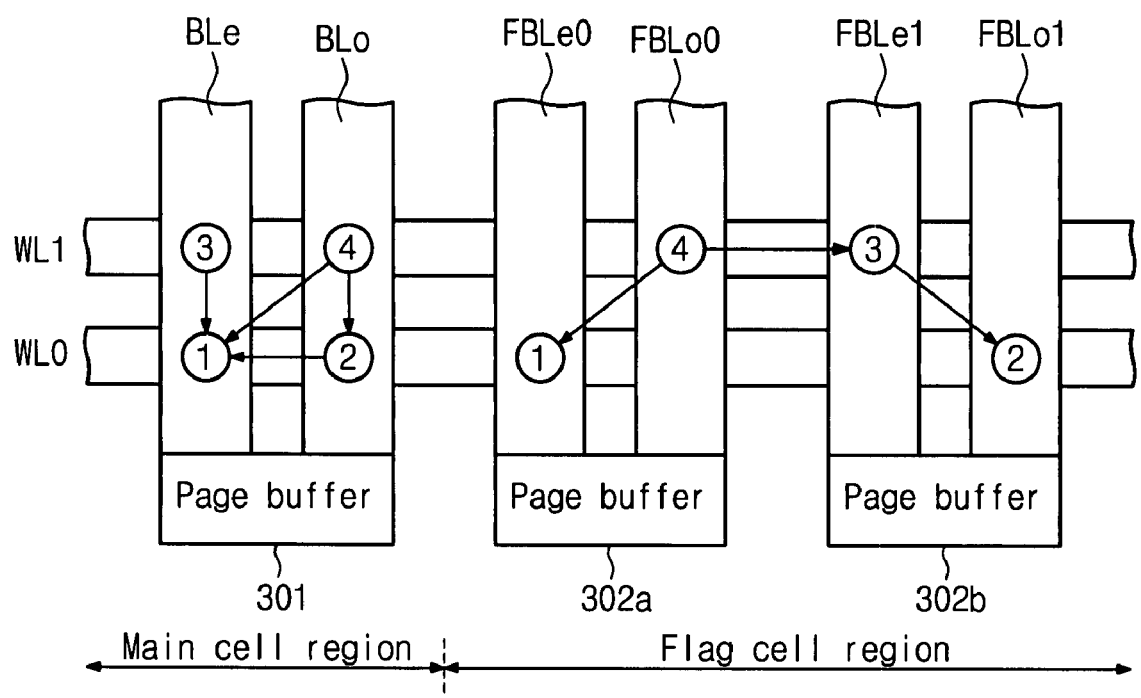
Figure 8:
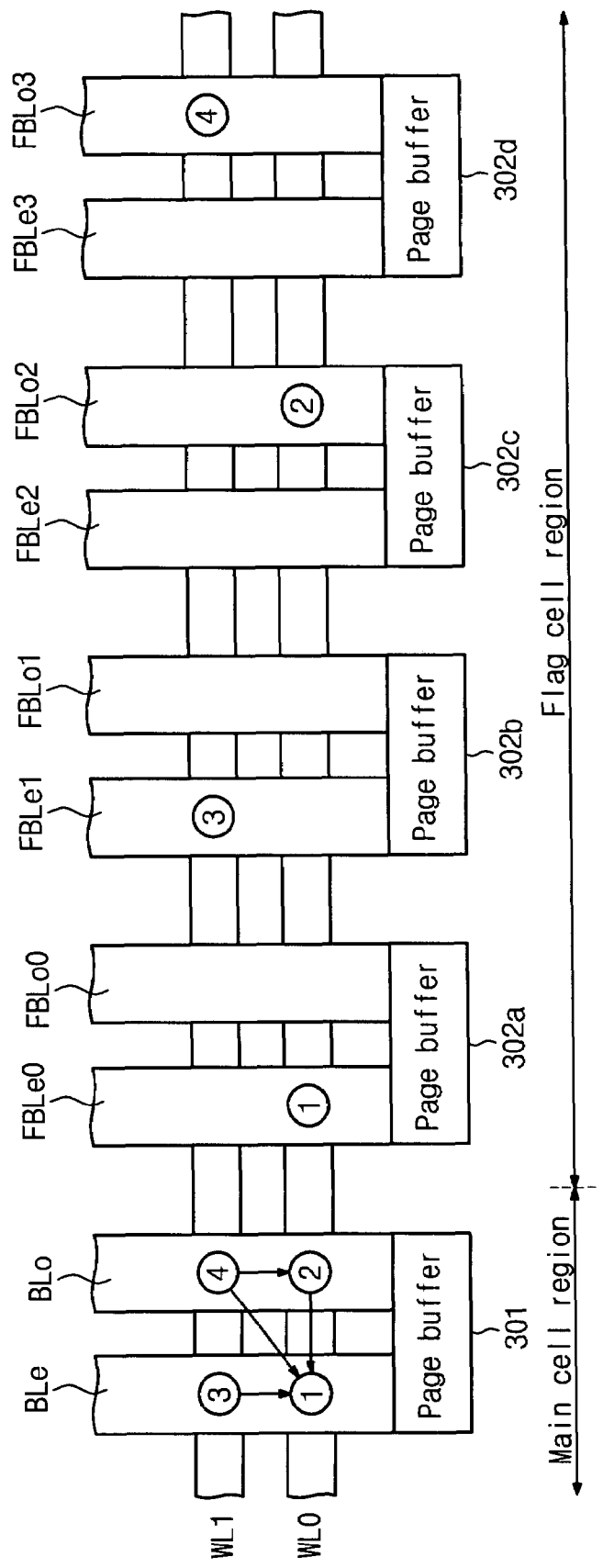

FIGS. 6 through 8 illustrate flag cell program processes for the flash memory device 1000 of FIG. 4 according to example embodiments of the present invention. In an example, the flash memory device 1000 may reduce (e.g., minimize) the F-poly coupling between the flag cells, as will now be described in greater detail with respect to FIGS. 6 through 8.

In the example embodiment of FIG. 6, two pairs of flag bit lines (FBLe0, FBLo0) and (FBLe1, FBLo1) may be provided in a flag cell region. Page buffers 302a and 302b may be connected to the corresponding flag bit line pairs (FBLe0, FBLo0) and (FBLe1, FBLo1), respectively. As shown in FIG. 6, the flag cells may be programmed in a different manner as compared to the main cells. As mentioned above, a given row/word line may include two pages (e.g., even and odd-numbered pages). The even-numbered page may include main cells arranged at intersections of a given word line (e.g., WL0) and even-numbered bit lines (BLe). The odd-numbered page may include main cells arranged at intersections of a given word line (e.g., WL0) and odd-numbered bit lines (BLo). The flag bit lines (FBLe0, FBLo0) may be connected to the page buffer 302a, and the flag bit lines (FBLe1, FBLo1) may be connected to the page buffer 302b.

In the example embodiment of FIG. 6, if a main cell ① (e.g., corresponding to an even-numbered page) defined by the word line WL0 and the even-numbered bit line BLe is programmed, information relevant to the even-numbered page may be set in the corresponding page buffer 302a by the control logic block 800, and a flag cell ① defined by the word line WL0 and the flag bit line FBLe0 may be programmed to have a given state (e.g., an uppermost state ST4 as in FIG. 1). If a main cell ② (e.g., corresponding to an odd-numbered page) defined by the word line WL0 and the bit line BLo is programmed, information relevant to the odd-numbered page may be set in the corresponding page buffer 302a by the control logic block 800, and a flag cell ② defined by the word line WL0 and the flag bit line FBLo0 may be programmed to have a given state (e.g., an uppermost state ST4 as in FIG. 1).

In the example embodiment of FIG. 6, page information relevant to a next word line WL1 (e.g., an adjacent word line) may be stored in flag cells connected to another pair of flag bit lines (FBLe1, FBLo1). For example, if a main cell ③ (e.g., corresponding to an even-numbered page) defined by the word line WL1 and the bit line BLe is programmed, information relevant to the even-numbered page may be set in the corresponding page buffer 302b by the control logic block 800, and a flag cell ③ defined by the word line WL1 and the flag bit line FBLe1 may be programmed to have a given state (e.g., an uppermost state ST4 as in FIG. 1). If a main cell ④ (e.g., corresponding to an odd-numbered page) defined by the word line WL1 and the bit line BLo is programmed, information relevant to the odd-numbered page may be set in the corresponding page buffer 302b by the control logic block 800, and a flag cell ④ defined by the word line WL1 and the flag bit line FBLo1 may be programmed to have a given state (e.g., an uppermost state ST4 as in FIG. 1).

In the example embodiment of FIG. 6, the flag cells ①, ② and ③ may undergo relatively limited F-poly coupling. If page information relevant to a word line WL2 is programmed, the flag cell ③ may receive F-poly coupling generated if a flag cell (e.g., defined by WL2 and FBLo0) is programmed. However, it will be appreciated that the F-poly coupling occurring when flag cells are programmed may be reduced as compared to the conventional art. Accordingly, an increase in threshold voltage of the flag cells by the F-poly coupling may likewise be reduced. Accordingly, an occurrence of read errors with respect to the flag cells may be reduced due to a decrease in on-cell current, and thereby a reliability of the flash memory device 1000 may be improved.

FIG. 7 illustrates an alternative flag cell program process for the flash memory device 1000 of FIG. 4 according to another example embodiment of the present invention. In the example embodiment of FIG. 7, two flag bit line pairs (FBLe0, FBLo0) and (FBLe1, FBLo1) may be provided in a flag cell region. The flag bit line pairs (FBLe0, FBLo0) and (FBLe1, FBLo1) may be connected to corresponding page buffers 302a, 302b, respectively.

In the example embodiment of FIG. 7, if a main cell ① (e.g., corresponding to an even-numbered page) defined by a word line WL0 and a bit line BLe is programmed, information relevant to the even-numbered page may be set in the corresponding page buffer 302a by the control logic block 800, and a flag cell ① defined by the word line WL0 and the flag bit line FBLe0 may be programmed to have a given state (e.g., an uppermost state ST4 as in FIG. 1). If a main cell ② (e.g., corresponding to an odd-numbered page) defined by the word line WL0 and a bit line BLo is programmed, information relevant to the odd-numbered page may be set in the corresponding page buffer 302b by the control logic block 800, and a flag cell ② defined by the word line WL0 and the flag bit line FBLo1 may be programmed to have a given state (e.g., an uppermost state ST4 as in FIG. 1).

In the example embodiment of FIG. 7, if a main cell ③ (e.g., corresponding to an even-numbered page) defined by a word line WL1 and the bit line BLe is programmed, information relevant to the even-numbered page may be set in the corresponding page buffer 302b by the control logic block 800, and a flag cell ③ defined by the word line WL1 and the flag bit line FBLe1 may be programmed to have a given state (e.g., an uppermost state ST4 as in FIG. 1). If a main cell ④ (e.g., corresponding to an odd-numbered page) defined by the word line WL1 and the bit line BLo is programmed, information relevant to the odd-numbered page may be set in the corresponding page buffer 302a by the control logic bock 800, and a flag cell ④ defined by the word line WL1 and the flag bit line FBLo0 may be programmed to have a given state (e.g., an uppermost state ST4 as in FIG. 1).

In the example embodiment of FIG. 7, the flag cells ①, ②, and ③ may undergo relatively limited F-poly coupling. If page information relevant to a word line WL2 is programmed, the flag cells ③ and ④ may receive F-poly coupling generated by flag cells (e.g., defined by WL2 and FBLe0, and WL2 and FEBLe1). However, it will be appreciated that the F-poly coupling occurring when flag cells are programmed may be reduced as compared to the conventional art. Accordingly, an increase in threshold voltage of the flag cells by the F-poly coupling may likewise be reduced. Accordingly, an occurrence of read errors with respect to the flag cells may be reduced due to a decrease in on-cell current, and thereby a reliability of the flash memory device 1000 may be improved.

FIG. 8 illustrates another alternative flag cell program process for the flash memory device 1000 of FIG. 4 according to another example embodiment of the present invention. In the example embodiment of FIG. 8, four flag bit line pairs (FBLe0, FBLo0), (FBLe1, FBLo1), (FBLe2, FBLo2) and (FBLe3, and FBLo3) may be provided in a flag cell region. The flag bit line pairs (FBLe0, FBLo0), (FBLe1, FBLo1), (FBLe2, FBLo2), and (FBLe3, FBLo3) may be connected to corresponding page buffers 302a, 302b, 302c and 302d, respectively.

In the example embodiment of FIG. 8, if a main cell ① (e.g., corresponding to an even-numbered page) defined by a word line WL0 and a bit line BLe is programmed, information relevant to the even-numbered page may be set in the corresponding page buffer 302a by the control logic block 800, and a flag cell ① defined by the word line WL0 and the flag bit line FBLe0 may be programmed to have a given state (e.g., an uppermost state ST4 as in FIG. 1). If a main cell ② (e.g., corresponding to an odd-numbered page) defined by the word line WL0 and a bit line BLo is programmed, information relevant to the odd-numbered page may be set in the corresponding page buffer 302c by the control logic block 800, and a flag cell ② defined by the word line WL0 and the flag bit line FBLo2 may be programmed to have a given state (e.g., an uppermost state ST4 as in FIG. 1).

In the example embodiment of FIG. 8, if a main cell ③ (e.g., corresponding to an even-numbered page) defined by a word line WL1 and the bit line BLe is programmed, information relevant to the even-numbered page may be set in the corresponding page buffer 302b by the control logic block 800, and a flag cell ③ defined by the word line WL1 and the flag bit line FBLe1 may be programmed to have a given state (e.g., an uppermost state ST4 of FIG. 1). If a main cell ④ (e.g., corresponding to an odd-numbered page) defined by the word line WL1 and the bit line BLo is programmed, information relevant to the odd-numbered page may be set in the corresponding page buffer 302d by the control logic block 800, and a flag cell ④ defined by the word line WL1 and the flag bit line FBLo3 may be programmed to have a given state (e.g., an uppermost state ST4 as in FIG. 1).

Accordingly, in the example embodiment of FIG. 8, it will be appreciated that the F-poly coupling between the respective flag cells may be reduced, such that an increase in threshold voltage of the flag cells due to the F-poly coupling may likewise be reduced.

In the example embodiments of FIGS. 4 through 8, page information may be read by the page buffers 302 under control of the control logic block 800, and the read page information may be provided to the control logic block 800. The control logic block 800 may output the input page information to an external entity through the selection circuit 600. Accordingly, defective flag cells may be more readily determined and replaced with redundant or replacement bit lines.

For example, referring to FIGS. 4 through 8, in order to output data read by the page buffers 301, the control logic block 800 may transition (e.g., activate) a selection signal SEL to the first logic level (e.g., a higher logic level or logic "1"). If the selection signal SEL is transitioned to the first logic level, the page information transmitted from the control logic block 800 may be output to an external entity or device through the selection circuit and the input/output interface 700. Thereafter, detection information may be programmed into a fuse box (not shown) and/or the control logic block 800 of the flash memory device 1000, and the program detection information may be used to reduce (e.g., prevent) access to the defective flag bit line and to access a redundancy flag bit line (e.g., substituting for the defective unit). Accordingly, a reliability of information stored in a flag cell e.g., where a defective flag cell may potentially cause a fatal operational error) may be improved.

Example embodiments of the present invention being thus described, it will be obvious that the same may be varied in many ways. For example, while above-described example embodiments of the present invention have been generally described and illustrated with respect to NAND flash memory devices, it will be appreciated that other example embodiments of the present invention need not be so limited and may be directed to any type of volatile and/or non-volatile memory device (e.g., a NOR flash device, etc.). Further, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A non-volatile memory device, comprising:
    a plurality of main cells, each of the plurality of main cells arranged at first intersection regions between one of a plurality of word lines and one of a plurality of main bit line pairs; and
    a plurality of flag cells, each of the plurality of flag cells arranged at second intersection regions between one of the plurality of word lines and a plurality of flag bit line pairs, each of the plurality of flag cells configured to store page information in a manner such that page information associated with main cells corresponding to one of the main bit line pairs is stored in flag cells corresponding to more than one of the flag bit line pairs,
    wherein a first page information and a second page information corresponding to a first main memory cell and a second memory cell commonly coupled to the one of the plurality main bit lines, are stored to a first flag cell coupled to a first flag bit line and a second flag cell coupled to a second flag bit line, respectively.

2. The non-volatile memory device of claim 1, further comprising:
    a plurality of first page buffers, each of the plurality of first page buffers connected to one of the plurality of main bit line pairs;
    a plurality of second page buffers, each of the plurality of second page buffers connected to one of the plurality of flag bit line pairs; and
    a control logic block configured to manage the second page buffers in order to the manner in which the page information is stored within the flag cells.

3. The non-volatile memory device of claim 1, wherein each of the plurality of word lines includes two pages, and the plurality of flag bit line pairs include first and second flag bit line pairs.

4. The non-volatile memory device of claim 3, wherein first page information associated with a given even-numbered word line among the plurality of word lines is programmed into flag cells connected to an even-numbered flag bit line of the first flag bit line pair, and second page information associated with the given even-numbered word line is programmed into flag cells connected to an odd-numbered flag bit line of the first flag bit line pair,
    and wherein even and odd denotations distinguish between different bit lines of a bit line pair.

5. The non-volatile memory device of claim 4, wherein first page information associated with a given odd-numbered word line among the plurality of word lines is programmed into flag cells connected to an even-numbered flag bit line of the second flag bit line pair, and second page information associated with the given odd-numbered word line is programmed into flag cells connected to an odd-numbered flag bit line of the second flag bit line pair.

6. The non-volatile memory device of claim 3, wherein first page information associated with a given odd-numbered word line among the plurality of word lines is programmed into flag cells connected to an even-numbered flag bit line of the second flag bit line pair, and second page information associated with the given odd-numbered word line is programmed into flag cells connected to an odd-numbered flag bit line of the second flag bit line pair,
    and wherein even and odd denotations distinguish between different bit lines of a bit line pair.

7. The non-volatile memory device of claim 3, wherein first page information associated with a given even-numbered word line among the plurality of word lines is programmed into flag cells connected to an even-numbered flag bit line of the first flag bit line pair, and second page information associated with the given odd-numbered word line is programmed into flag cells connected to an odd-numbered flag bit line of the second flag bit line pair, and wherein even and odd denotations distinguish between different bit lines of a bit line pair.

8. The non-volatile memory device of claim 7, wherein first page information associated with a given odd-numbered word line among the plurality of word lines is programmed into flag cells connected to an even-numbered flag bit line of the second flag bit line pair, and second page information associated with the given odd-numbered word line is programmed into flag cells connected to an odd-numbered flag bit line of the first flag bit line pair.

9. The non-volatile memory device of claim 3, wherein first page information associated with a given odd-numbered word line among the plurality of word lines is programmed into flag cells connected to an even-numbered flag bit line of the second flag bit line pair, and second page information associated with the given odd-numbered word line is programmed into flag cells connected to an odd-numbered flag bit line of the first flag bit line pair, and wherein even and odd denotations distinguish between different bit lines of a bit line pair.

10. The non-volatile memory device of claim 1, wherein each of the plurality of word lines includes two pages, and the plurality of flag bit lines include first to fourth flag bit line pairs.

11. The non-volatile memory device of claim 10, wherein first page information associated with a given even-numbered word line among the plurality of word lines is programmed into flag cells connected to an even-numbered flag bit line of the first flag bit line pair, and second page information associated with the given even-numbered word line is programmed into flag cells connected to an odd-numbered flag bit line of the third flag bit line pair, and wherein even and odd denotations distinguish between different bit lines of a bit line pair.

12. The non-volatile memory device of claim 11, wherein first page information associated with a given odd-numbered word line among the plurality of word lines is programmed into flag cells connected to an even-numbered flag bit line of the second flag bit line pair, and second page information associated with the given odd-numbered word line is programmed into flag cells connected to an odd-numbered flag bit line of the fourth flag bit line pair.

13. The non-volatile memory device of claim 2, further comprising:
a column selection circuit selecting the first page buffers in units having a given length during a read operation;
a multiplexer controlled by the control logic block, and configured to select one or more outputs of the first page buffers selected by the column selection circuit; and
an input/output interface outputting an output of the multiplexer.

14. The non-volatile memory device of claim 13, wherein if one of the plurality of word lines is selected, the second page buffers read page information from flag cells of the selected word line under control of the control logic block, and the control logic block controls the multiplexer such that the read page information is output via the input/output interface.

15. The non-volatile memory device of claim 2, further comprising:
at least one redundancy flag bit line pair for replacing a defective flag bit line pair of the plurality of flag bit line pairs; and
a redundancy page buffer controlled by the control logic block, and connected to the redundancy bit line pair.

16. A method of operating a non-volatile memory device, comprising:
arranging each of a plurality of main cells at first intersection regions between one of a plurality of word lines and one of a plurality of main bit line pairs; and
storing page information within at least one of a plurality of flag cells, each of the plurality of flag cells arranged at second intersection regions between one of the plurality of word lines and a plurality of flag bit line pairs, the page information stored in a manner such that page information associated with main cells corresponding to one of the main bit line pairs is stored in flag cells corresponding to more than one of the flag bit line pairs,
wherein a first page information and a second page information corresponding to a first main memory cell and a second memory cell commonly coupled to one of the plurality of main bit lines, are stored to a first flag cell coupled to a first flag bit line and a second flag cell coupled to a second flag bit line, respectively.

17. The method of claim 16, wherein the storing stores the page information in flag cells associated with two flag bit line pairs.

18. The method of claim 16, wherein the storing stores the page information in flag cells associated with four flag bit line pairs.

19. A non-volatile memory device, comprising:
a first main cell coupled to a first word line and a first main bit line;
a second main cell coupled to a second word line and the first main bit line;
a first flag cell coupled to the first word line to store a first page information corresponding to the first main cell;
a second flag cell coupled to the second word line to store a second page information corresponding to the second main cell,
wherein the first flag cell and the second flag cell are coupled to different flag bit lines, respectively.

20. The non-volatile memory device of claim 19, wherein at least one flag bit line is allocated between the different bit lines.

* * * * *